United States Patent [19]
Johnson

[11] Patent Number: 5,592,017
[45] Date of Patent: Jan. 7, 1997

[54] SELF-ALIGNED DOUBLE POLY BJT USING SIGE SPACERS AS EXTRINSIC BASE CONTACTS

[75] Inventor: F. Scott Johnson, Plano, Tex.

[73] Assignee: Texas Instruments Incorporated, Dallas, Tex.

[21] Appl. No.: 473,415

[22] Filed: Jun. 7, 1995

Related U.S. Application Data

[62] Division of Ser. No. 409,558, Mar. 23, 1995.

[51] Int. Cl.[6] .................... H01L 29/73; H01L 29/737
[52] U.S. Cl. ............... 257/554; 257/587; 257/588; 257/197
[58] Field of Search ......................... 257/197, 554, 257/587, 588

[56] References Cited

U.S. PATENT DOCUMENTS

| | | | |
|---|---|---|---|
| 4,975,381 | 12/1990 | Taka et al. | 257/588 |
| 5,121,184 | 6/1992 | Huang et al. | 257/588 |
| 5,198,689 | 3/1993 | Fujioka | 257/197 |
| 5,323,032 | 6/1994 | Sato et al. | 257/588 |
| 5,500,554 | 3/1996 | Sato | 257/588 |
| 5,502,330 | 3/1996 | Johnson | 257/588 |

FOREIGN PATENT DOCUMENTS 0551185  7/1993  European Pat. Off. ............. 257/197

*Primary Examiner*—Jerome Jackson
*Attorney, Agent, or Firm*—Jacqueline J. Garner; William E. Hiller; Richard L. Donaldson

[57] ABSTRACT

A bipolar transistor (100) and a method for forming the same. A base electrode (114) is separated from the collector region (102) by an insulator layer (110). A doped conductive spacer (115) is formed laterally adjacent the base electrode (114). The conductive spacer (115) comprises a conductive material that is capable of serving as a dopant source for n and p-type dopants and is able to be selectively etched with respect to silicon (e.g., silicon-germanium). Base link-up region (112) is diffused from conductive spacer (115) into the collector region (102). Processing then continues to form an intrinsic base region (108), emitter region (126), and emitter electrode (124).

4 Claims, 2 Drawing Sheets

5,592,017

SELF-ALIGNED DOUBLE POLY BJT USING SIGE SPACERS AS EXTRINSIC BASE CONTACTS

This is a Division of application Ser. No. 08/409,558 filed Mar. 23, 1995.

FIELD OF THE INVENTION

This invention generally relates to semiconductor structures and processes and more specifically bipolar transistors.

BACKGROUND OF THE INVENTION

Bipolar transistors (BJTs) are commonly used in semiconductor devices especially for high speed operation and large drive current applications. A double polysilicon BJT 10 is shown in FIG. 1. The area for the BJT 10 is isolated by field oxides 12. The collector 14 is a lightly doped epitaxial layer of one conductivity type and the base region is formed by doped regions 16 and 18 of the opposite conductivity type. Doped region 16 is called the intrinsic base region and region 18 is the extrinsic base region. The extrinsic base region 18 provides an area for connecting to the base region. The base electrode 20 comprises a first doped polysilicon layer. The emitter region 22 is a doped region of the same conductivity type as the collector and is located within the intrinsic base region 16. The emitter electrode 24 is accomplished with a second doped polysilicon layer. Oxide region 26 and base-emitter spacers 28 isolate the emitter electrode 24 from the base electrode 20. Double polysilicon BJTs have the further advantage of lower base resistance and reduced extrinsic capacitances over single polysilicon BJTs. However, this advantage is gained by accepting additional process complexities such as those associated with the etching of polysilicon from the active device areas and the out diffusion of a base link-up doping region from a highly doped polysilicon diffusion source.

Another prior art double polysilicon BJT 50 is shown in FIG. 2. A base link-up region 52 is used to contact the intrinsic base region. Base link-up region 52 is formed by the diffusion of dopant from polysilicon spacers 54. An insulator region 56 separates the base polysilicon from the collector region. Advantages of this approach include the elimination of extrinsic capacitance and reduced device area. However, this approach still has the process complexity of having to etch polysilicon directly from the silicon active area.

The advantages of the double polysilicon BJT must currently be balanced against the process complexities described above. Accordingly, there is a need for a method of forming a BJT that reduces these process complexities.

SUMMARY OF THE INVENTION

A bipolar transistor and a method for forming the same are disclosed herein. The base electrode is separated from the collector region by an insulator layer. A doped conductive spacer is formed laterally adjacent the base electrode. The conductive spacer comprises a conductive material that is capable of serving as a dopant source for n and p-type dopants and is able to be selectively etched with respect to silicon (e.g., silicon-germanium). Base link-up region is diffused from the conductive spacer into the collector region. Processing then continues to form an intrinsic base region, emitter region, and emitter electrode.

An advantage of the invention is providing a method of forming a bipolar transistor that eliminates the overetching and damage from etching polysilicon directly from the device active area.

A further advantage of the invention is providing a method of foxing a bipolar transistor that enables reliable and simple fabrication of a self-aligned base link-up region.

A further advantage of the invention is providing a method of forming a bipolar transistor that eliminates most of the extrinsic base capacitance.

These and other advantages will be apparent to those skilled in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a double polysilicon bipolar transistor (BJT) formed using a BiCMOS process. It will be apparent to those skilled in the art that the invention is also applicable to other BiCMOS processes and devices as well as to bipolar processes and devices.

Figure 1:
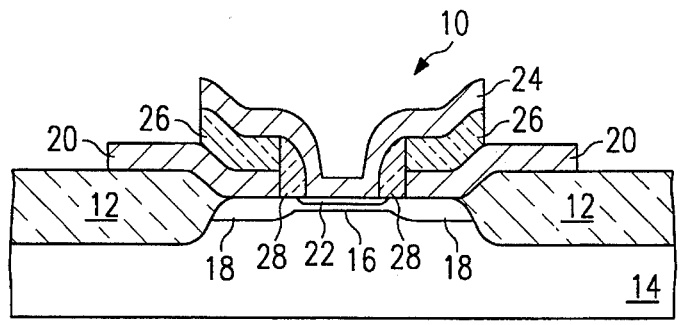
FIG. 1 is a cross-sectional diagram of a first prior art BJT.
Figure 2:
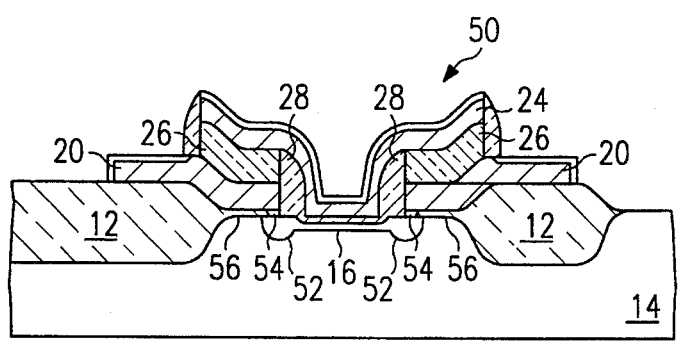
FIG. 2 is a cross-sectional diagram of a second prior art BJT.
Figure 3:
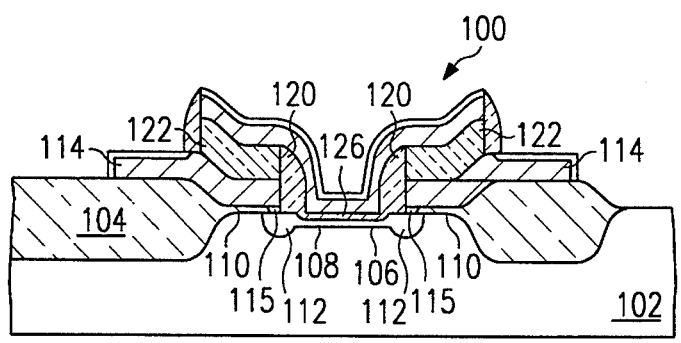
FIG. 3 is a cross-sectional diagram of a BJT according to the invention.

A BJT 100 according to the invention is shown in FIG. 3. Field insulating regions 104 isolate BJT 100 from other devices (not shown), such as other BJTs, MOS transistors, diodes and resistors, etc. Region 102 is a collector region. Many suitable collector regions are well known in the art. For example, collector region 102 may comprise a buried collector and a lightly doped epitaxial layer such as that described in U.S. Pat. No. 4,958,213, issued Sep. 18, 1990 and assigned to Texas Instruments, Inc.

The base region 106 consists of an intrinsic base region 108 and a base link-up region 112. Intrinsic base region 108 is the region in which the emitter region is located. Base link-up region 112 provides a low resistance/low capacitance connection between the base electrode 114 and the intrinsic base regions 108 and is self-aligned to both the base electrode 114 and the intrinsic base region 108. The intrinsic and base link-up regions (108 and 112) have the same conductivity type. For example, if the collector region 102 is n-type, the base regions 108 and 112 are p-type. Alternatively, if the collector region 102 is p-type, the base regions 108 and 112 are n-type. Because the conventional extrinsic base region is eliminated, the extrinsic capacitance is almost entirely eliminated as well. Connection is made to the base region 108 through a smaller self-aligned base link-up region 112.

Base electrode 114 comprises doped polysilicon and is separated from the collector region 102 by an insulator layer 110. A conductive spacer 115 is used to connect the base electrode 114 to the base link-up region 112. The doping of base electrode 114 is adjusted to provide the desired conductivity for the base electrode. In contrast, prior art techniques required the doping of the base electrode to be adjusted based on providing a low resistance link-up region to the intrinsic base region. Because base electrode 114 is not the dopant source for the base link-up region 112, the dopant concentration of the base electrode is uncoupled from the resistivity of the base link-up region 112.

Conductive spacer 115 is the dopant source for base link-up region 112. Conductive spacer 115 comprises a material that is conductive, capable of acting as a dopant source for n-type and/or p-type dopants and may be selectively etched with respect to silicon. It should also be compatible with conventional semiconductor processing. For example, conductive spacer 115 may comprise silicon-germanium (SiGe). Conductive spacer 115 enables the reliable and simple fabrication of a self-aligned base link-up region 112 and eliminates almost all of the extrinsic capacitance.

Base-emitter spacers 120 provide the spacing between the ends of the emitter region 126 and the ends of the intrinsic base region 108. In addition, the combination of base-emitter spacers 120 and dielectric layer 122 isolate the emitter electrode 124 and the base electrode 114. Emitter electrode 124 preferably comprises doped polysilicon and is the dopant source for emitter region 126. Emitter electrode 124 has the opposite conductivity of base electrode 114.

Figure 4:
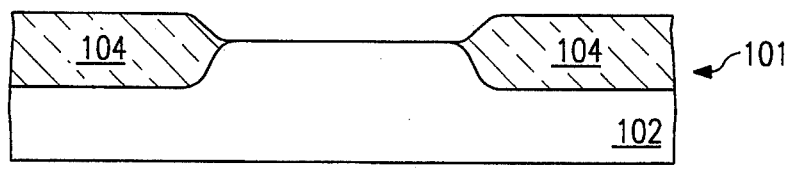
FIGS. 4–8 are cross-sectional diagrams of the BJT of FIG. 3 at various stages of fabrication.

FIG. 4 illustrates a semiconductor body 101 after the formation of collector region 102 and field insulating regions 104. Collector region 102 may comprise a buried layer, an epitaxial layer and a deep N+ collector sink as is well known in the art. The formation of a BJT 100 according to the invention into the structure of FIG. 4 will now be described.

Figure 5:
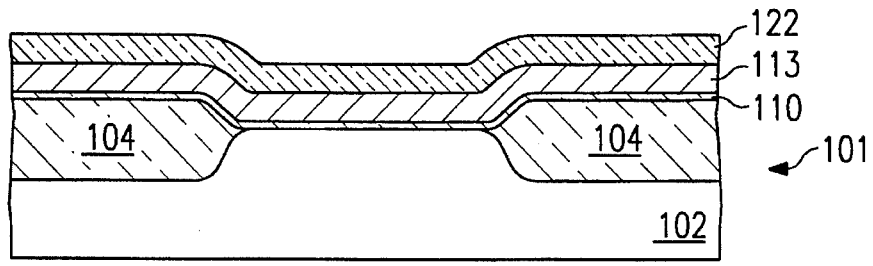
Figure 6:
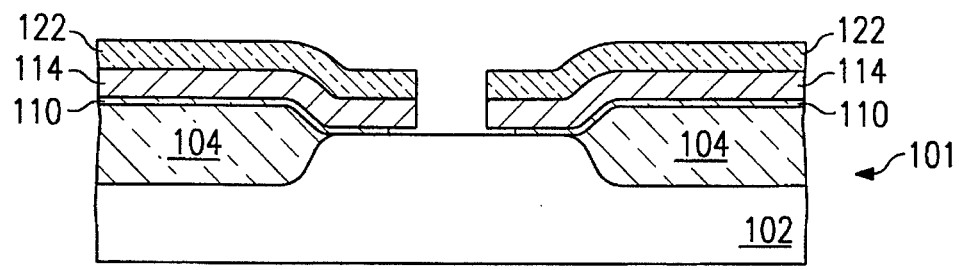

Referring to FIG. 5, an insulator layer 110 is formed over the surface of the structure to a thickness on the order of 1000–2000 ÅAngstroms. Insulator layer 110 may comprise, for example, thermal oxide. A first layer of polysilicon 113 is deposited over insulator layer 110 to a thickness on the order of 2000 Angstroms. An interlevel dielectric layer 122 is deposited over polysilicon layer 113 to a thickness on the order of 3000 Angstroms. The first layer of polysilicon 113 may be doped insitu or implant doped after deposition so that a low resistance base electrode 114 may be formed therefrom. The first layer of polysilicon 113, the interpoly dielectric 116, and the insulator layer 110 are then etched as shown in FIG. 6 to form the base electrode 114. The interpoly dielectric etch stops on the polysilicon, the polysilicon etch stops on insulator layer 110, and the insulator layer 110 etch stops on the silicon active area. Because conventional insulator etches are highly selective to silicon, the active area is protected from overetching and crystal damage. Prior art approaches, in contrast, require polysilicon to be etched directly from the silicon active area. Because polysilicon etches are not very selective to the silicon active area, damage may occur to the active area in prior art devices. As shown in FIG. 6, the etch of insulator layer 110 may be extended to undercut insulator layer 110 beneath base electrode 114.

Figure 7:
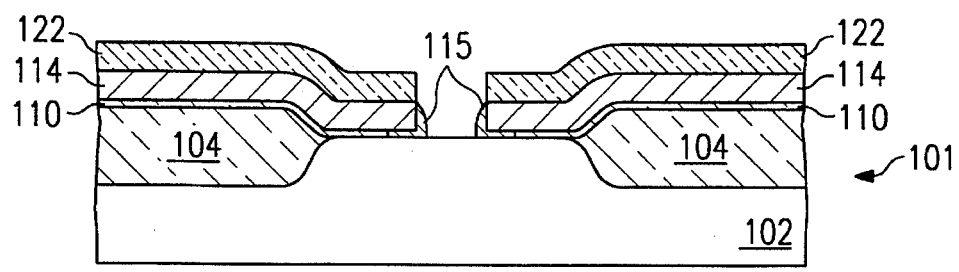
Figure 8:
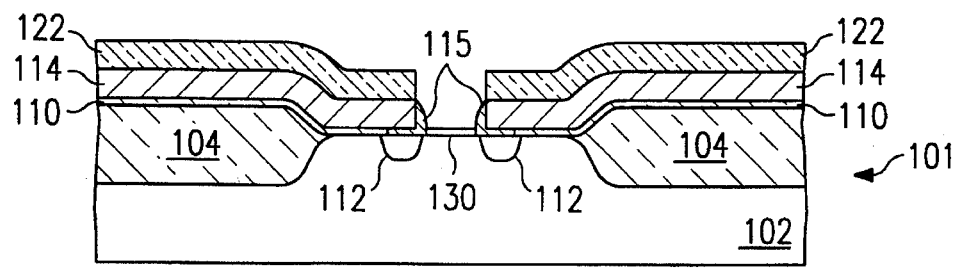

Next, a layer of conductive, diffusion source material is deposited and etched to form conductive spacers 115, as shown in FIG. 7. The conductive, diffusion source material is capable of acting as a dopant source for n-type and/or p-type dopants and may be selectively etched with respect to silicon. It should also be compatible with conventional semiconductor processing. For example, conductive spacer 115 may comprise silicon-germanium (SiGe). Polycrystalline SiGe can be deposited, insitu-doped or implanted and etched just like polysilicon except that it can be etched selectively with respect to silicon. Selectivities in the range of 9–18 are easily obtainable with conventional reactive ion etching or plasma etching, for example using $SF_6$ and $O_2$. Conductive spacer 115 is doped either in-situ or after deposition so that it may provide a dopant source for base-link-up region 112. An anneal cycle follows. The anneal is used to grow a screen oxide 130 while simultaneously diffusing the base link-up region 112 from the conductive spacer 115 as shown in FIG. 8. The surface concentration of dopant at the interface is preferably on the order of $5E19/cm^3$.

Processing continues in a conventional manner to complete the structure of FIG. 3. Intrinsic base region 108 is implanted through screen oxide 130 and diffused. Base-emitter spacers 120 are then formed to space the edges of a subsequently formed emitter region from the intrinsic base region edges. Base-emitter spacers 120 may comprise, for example, silicon-dioxide. The second layer of polysilicon 132 is then deposited to thickness on the order of 2.5KÅ. Polysilicon layer 132 may be doped in-situ or implant doped after deposition. Finally, the second polysilicon layer is patterned and etched to form the emitter electrode 124 and the emitter region 126 is diffused from the second polysilicon layer/emitter electrode either prior to or subsequent to the second polysilicon etch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bipolar transistor comprising:

a collector region:

an intrinsic base region within said collector region;

a base link-up region within said collector region and self-aligned to said intrinsic base region;

a conductive spacer located above and in contact with said base link-up region, said conductive spacer comprising a material that may be selectively etched with respect to silicon;

a base electrode separated from said collector region by an insulator layer, said base electrode connected to said intrinsic base region through said conductive spacer and said base link-up region wherein said conductive spacer is located laterally adjacent said base electrode; and an emitter region within said intrinsic base region.

2. The bipolar transistor of claim 1, wherein said conductive spacer comprises silicon-germanium.

3. The bipolar transistor of claim 1, wherein said bipolar transistor comprises two layers of polysilicon.

4. The bipolar transistor of claim 1, wherein said insulator layer is undercut from said base electrode.

* * * * *